(12) United States Patent
Grosz (10) Patent No.: US 10,782,345 B2
(45) Date of Patent: Sep. 22, 2020

(54) DEBUGGING A SEMICONDUCTOR DEVICE

(71) Applicant: Micron Technology, Inc., Boise, ID (US)

(72) Inventor: Nadav Grosz, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 16/022,039

(22) Filed: Jun. 28, 2018

(65) Prior Publication Data
US 2020/0003833 A1    Jan. 2, 2020

(51) Int. Cl.
*G06F 11/00* (2006.01)
*G01R 31/317* (2006.01)
*G01R 31/3177* (2006.01)
*G06F 11/263* (2006.01)

(52) U.S. Cl.
CPC ... *G01R 31/31713* (2013.01); *G01R 31/3177* (2013.01); *G01R 31/31726* (2013.01); *G06F 11/263* (2013.01)

(58) Field of Classification Search
CPC ......... G11C 29/00; G11C 29/06; G11C 29/08; G11C 29/10; G11C 29/12; G11C 29/1201; G11C 29/38; G01R 31/31713; G01R 31/31726; G01R 31/3177; G06F 11/22; G06F 11/2205; G06F 11/2221; G06F 11/26; G06F 11/261; G06F 11/263; G06F 11/267; G06F 11/273; G06F 11/2733
See application file for complete search history.

(56) References Cited

U.S. PATENT DOCUMENTS

| 6,681,359 B1 * | 1/2004 | Au | G01R 31/318533 714/727 |
| 7,149,927 B2 * | 12/2006 | Stancil | G06F 11/261 714/31 |
| 8,677,196 B1 * | 3/2014 | Gregor | G11C 29/1201 714/718 |
| 2013/0036254 A1 * | 2/2013 | Fai | G06F 11/263 711/103 |
| 2018/0039596 A1 * | 2/2018 | Shin | G06F 13/4282 |

OTHER PUBLICATIONS

Whetsel, Lee, "A High Speed Reduced Pin Count JTAG Interface", International Test Conference, 2006, pp. 1-10 (Year: 2006).*
"Introduction to the Universal Flash Storage Association", White Paper, pp. 1-11 (Year: 2013).*

* cited by examiner

*Primary Examiner* — Michael Maskulinski
(74) *Attorney, Agent, or Firm* — Schwegman Lundberg & Woessner, P.A.

(57) ABSTRACT

Devices and techniques are disclosed herein for debugging a device implemented on a die using non-test pins. An instruction to enable a debugging mode of operation is received with a memory device implemented at least in part on a die. In response to receiving the instruction, functionality of a first non-test pin of the die is modified to enable debugging data to be transmitted to a debugging component external to the die over the first non-test pin of the die. A debugging clock signal is established using a signal received at a second non-test pin of the die. Information including the debugging data is exchanged between the die and the debugging component using the first and second non-test pins of the die.

18 Claims, 3 Drawing Sheets

DEBUGGING A SEMICONDUCTOR DEVICE

TECHNICAL FIELD

Embodiments of the disclosure relate generally to debugging a semiconductor device, and more specifically, to performing debugging a semiconductor device (e.g., a memory device) using non-test pins of the device.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Many electronic devices include several main components: a host processor (e.g., a central processing unit (CPU) or other main processor); main memory (e.g., one or more volatile or non-volatile memory (NVM) device, such as dynamic RAM (DRAM), mobile or low-power double-data-rate synchronous DRAM (DDR SDRAM), etc.); and a storage device (e.g., an NVM device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

In some cases, errors may arise while operating the memory devices. To resolve errors that arise, a debugging device can be connected to the memory devices using, for example, a cJTAG interface. The debugging device may then perform step-by-step analysis of firmware of the memory devices to identify potential causes for the errors.

BRIEF DESCRIPTION OF THE DRAWINGS

The present disclosure will be understood more fully from the detailed description given below and from the accompanying drawings of various embodiments of the disclosure.

DETAILED DESCRIPTION

This document addresses various techniques for debugging a semiconductor device through use of non-test pins of the semiconductor device (e.g., memory device). This document addresses various techniques for debugging a semiconductor device implemented on a die by changing a function of one or more of the non-test pins of the die (for example, in a discussed embodiment, pins such as a reset pin and a clock pin or RST_N and REF_CLK pins of a UFS device), and using the non-test pin(s) to exchange debugging information with an external debugging component.

As defined herein, the term "pin" means a circuit node, which in many examples can include a contact pad configured to facilitate mechanical and electrical coupling between a given device (e.g., implemented on a die) and a supporting structure (such as, a printed circuit board, a semiconductor substrate, an interface component (such as, an interposer or substrate extension), etc.). Also, for purposes of the present description, the term "substrate" is used generically to refer to any supporting structures, and to other structures performing a similar support function unless expressly identified otherwise in a specific context.

Embedded devices may be implemented on a die or a chip and in some cases may need to be debugged. For example, errors or failure of the devices may be resolved by analyzing their internal structures (e.g., internal registers, memory cells, processor states, etc.). Some embedded devices may be implemented on a die or package that includes test pins dedicated for debugging operations. For example, the die may include cJTAG test serial data (TMSC) and test clock (TCKC) pins that may be connected to an external debugging component to communicate with an internal debugging module of the device. The die, on which the embedded devices are implemented, may be connected to a printed circuit board (PCB) by soldering or otherwise physically or mechanically coupling the pins of the die to the PCB. In some implementations, only a limited set of the pins (excluding the test pins) of the die are coupled to the PCB resulting in the test pins being left disconnected from the PCB. Debugging the embedded devices in these situations may be difficult, if not impossible, to perform because the test pins used for debugging are not accessible (e.g., because they are not connected to the PCB). To debug the devices in these circumstances, the dies or packages have to be physically removed from the PCB or underlying supporting structure.

This document addresses this technological problem with a technical solution that enables debugging semiconductor devices, implemented on a die, without removing the die from the supporting structure (e.g., PCB) to which they are connected. For purposes of the present description, the embodiments will use the example of the use of non-test or non-data pins of a semiconductor device constructed and operating in accordance with an example specification Universal Flash Storage (UFS) (e.g., UFS 2.1/UFS 3.0). The structures and operations described in this example are in no way limited to a specific specification, and may be applied to other semiconductor device and/or operational specifications with appropriate adaptation to the specifics of any such specifications. In accordance with this example specification, the reset and clock pins are always connected to the supporting structure. And though the identified specifications provide for dedicated debugging pins, in many cases those debugging pins may not be accessible to an external debugging component. Debugging operations are performed using the identified set of non-test pins by, for example, changing the function of one or more of these pins and exchanging debugging information with an external debugging component using these pins. For convenience and clarity in the present description, the on-chip debugging will be described as performed by a "debugging module." This use of this terminology for clarity is not meant to suggest that the structure and function of the "debugging module" is in any way separate or distinct from other control structure and functionality; and thus may be implemented, in some examples within a memory controller, which may be either a non-die controller or a separate logic device.

A debug operation can be triggered using a debug command from a host, such as an I2C command from the host to the memory controller, or a signal on a physical signal line (e.g., a debug line) of the serial communication interface (e.g., a DDR4 communication bus, etc.), etc. For example, an external debugging component (for purposes of the present example, as discussed above, the example external debugging component will be a cJTAG debugging device), may instruct a host coupled to a memory device to cause the memory device to enter a debugging mode of operation. The memory device may be implemented on a die that is connected to the host on a PCB. When the memory device receives the debug command, a debugging module of the memory device may be activated.

The debugging module of the memory device may be implemented on the same die as the memory device and may be coupled to a set of non-data or non-test pins of the die. The number of non-test pins the debugging module is coupled to may vary depending on the debugging protocol that is used. For purposes of this document, the cJTAG protocol will be described which involves use of two communication paths (e.g., two pins—data and clock) but any other protocol that uses any other number of communications paths may be used in a similar manner. Accordingly, in the cJTAG protocol implementation of this document, the debugging module is coupled to two non-test pins. In some implementations, the debugging module may also be coupled to corresponding test pins (e.g., a debug clock pin and a debug data pin) to enable debugging information to be exchanged when such test pins are connected to the support structure of the die.

Figure 1:
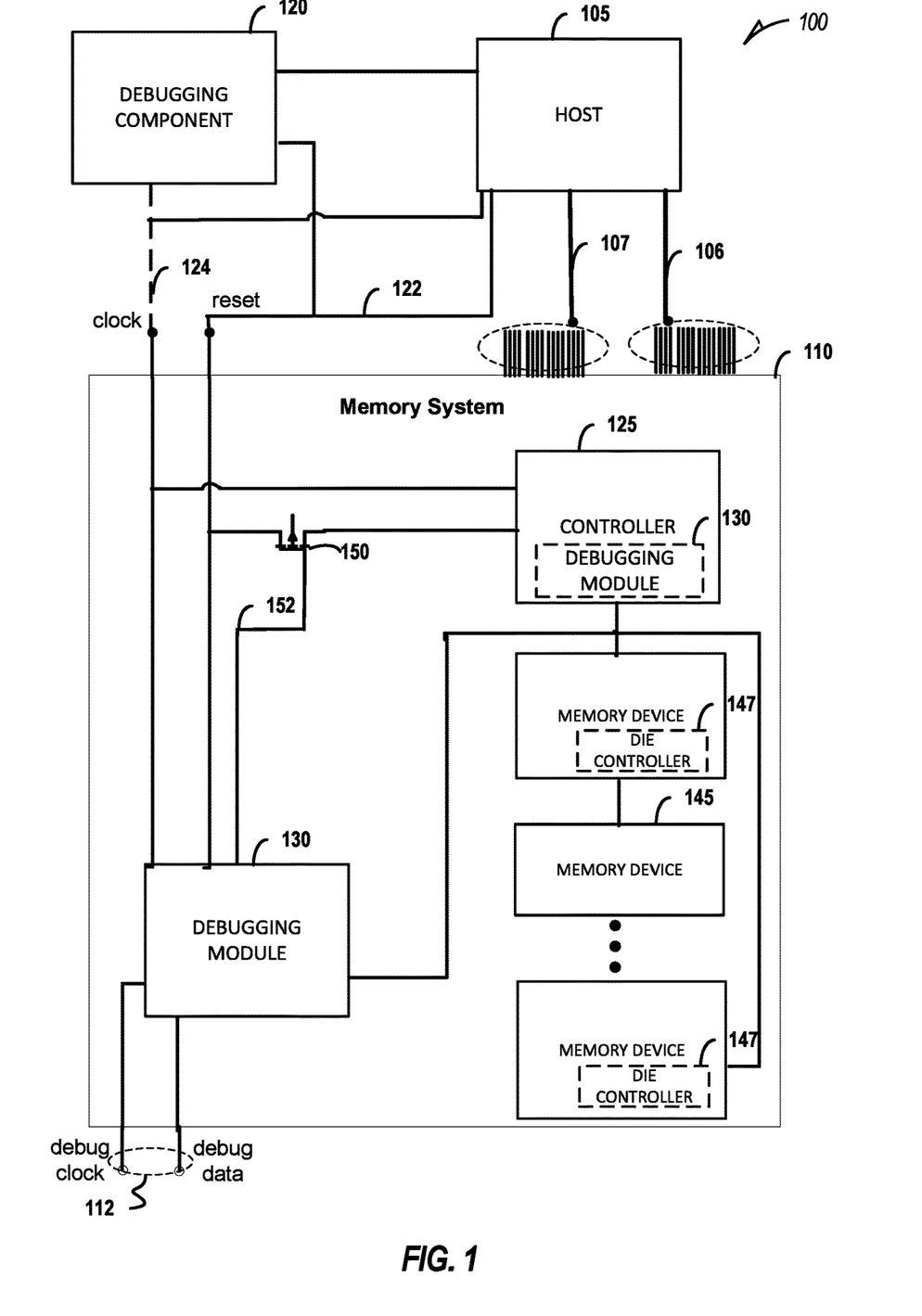
FIG. 1 illustrates an example of a memory device debugging system, in accordance with some examples of the present disclosure.

FIG. 1 illustrates an example system 100 including a host 105, a memory system 110 on which a memory device is implemented, and an external debugging component 120. Memory system 110 may include one or more die having a number of pins and through which a number of devices (e.g., debugging module 130, controller 125 and memory devices 145) implemented on the die communicate and interface with external components (e.g., host 105). For example, each device implemented in memory system 110 may interface with the host 105 using a die controller (e.g., controller 125). In some implementations, each device on system 110 may have its own die controller 147 for interfacing with host 105. In such circumstances, controller 125 may be omitted or be used to perform other functionality (e.g., to implement debugging module 130). In some implementations, each die controller 147 may implement a debugging module 130 or may interface with debugging module 130 to communicate debugging information to the external debugging component 120. Each memory device 145 may be located entirely on a discrete die, or may be formed from multiple memory die. The controller functionality (of controller 125 and/or die controller 147 implemented on each memory device 145) may be implemented either on the individual die, or on a separate die associated with one (or more) of the memory die.

The host 105 can include a host processor, a central processing unit, or one or more other processor, such as in an electronic (or host) device (e.g., a computer, a mobile phone, mobile device, etc.). The memory system 110 includes a controller 125 (e.g., a memory controller, a processing device, etc.), a memory device portion 145 (e.g., RAM, NAND, SRAM, etc.), a set of data pins 107, a set of address pins 106, a clock pin 124, a reset pin 122, and a set of debug or test pins 112. In an example, the memory devices 145 can conform to a JEDEC family of standards or one or more other standards.

Memory system 110 and/or memory devices 145 may be UFS devices. In such circumstances, reset pin 122 may be a UFS device hardware reset pin RST_N and clock pin 124 may be a UFS device reference clock pin REF_CLK. The RST_N pin provides a signal that resets one or more devices coupled to the RST_N pin. The REF_CLK pin provides a relatively low speed clock common to all UFS devices implemented on memory system 100 and is used as a reference for the PLL in each device implemented on memory system 100.

Memory system 110 may include any chip or package on which one or more electronic devices are implemented. Memory system 110 may include a number of pins that are used to connect the internal devices of memory system 110 to an external component (e.g., host 105 or external debugging component 120). For example, the pins of memory system 110 may be soldered to a PCB to which host 105 is also connected. Host 105 may then communicate with devices on memory system 110 over the soldered pins of memory system 110. Memory system 110 may be associated with a set of specifications that indicate which pins of memory system 110 are required to be connected to another device in order for devices implemented on memory system 110 to operate properly. For example, the specifications may indicate that the clock and reset pins of memory system 110 are always connected to an external clock and reset signal and that debug or test pins 112 do not need to be connected to any other device for devices implemented on memory system 110 to operate properly.

Memory system 110 may be directly connected to host 105 via the pins of memory system 110 or may be indirectly connected to host 105 via another die or PCB. For example, memory system 110 may be a one of multiple packages that are each connected on the same PCB or other die. The PCB that includes the multiple packages including memory system 110 may then be connected to another PCB that is the supporting structure of host 105. The multiple packages on the PCB may include identical devices or may include a variety of devices (e.g., voltage regulars, memory cells, controllers, storage devices, communications devices, etc.).

A debugging module 130 may be implemented on or external from memory system 110. Debugging module 130 may include dedicated debugging circuitry (e.g., programmable logic device circuitry or FPGA circuitry) or may include a processor, such as a general purpose processor configured to perform the process of debugging module 130 (e.g., described in connection with FIG. 2). In some implementations, debugging module 130 may include phase-locked loop (PLL) circuitry for skewing a clock signal to match a given frequency or to generate a new clock signal of a particular frequency. In some implementations, debugging module 130 may include one or more comparator circuitries for comparing a received clock signal (e.g., a debugging clock signal) with a target clock signal (e.g., a reference clock signal) to determine whether phases of the clock signals match. When phases are not aligned, the debugging module 130 may initiate a phase-alignment process. Debugging module 130 may include logic for communicating with one or more components (e.g., memory devices and registers) external to debugging module 130 to obtain and provide status or data information.

In some implementations, debugging module 130 may be external to memory system 110 and coupled to each of the multiple packages or some of the multiple packages on the PCB via respective pins (e.g., data pins, command pins, reset pins, and clock pins). In such circumstances, debugging module 130 may be implemented on its own die separate from memory system 110 that includes the devices to be debugged. Also, in such circumstances, debugging module 130 may include a set of pins (e.g., reset and clock) that according to its specifications are always connected to the supporting structure and the device to be debugged. In some implementations, debugging module 130 may be implemented on memory system 110 as its own component or as part of one of the other devices (e.g., controller 125 or controller 147) implemented on memory system 110.

The memory device portion 145 can include one or more volatile or non-volatile memory devices, DRAM, NAND memory, magnetic storage, phase change memory, NOR memory, or SRAM integrated circuits (ICS) to store data for read or write operations of the host 105 via the set of data pins 107 and address pins 106. In some implementations, each of the memory devices in memory device portion 145 (or a subset of such memory devices) may implemented its own or a portion of debugging module 130.

The host 105 can communicate with the controller 125 using the data pins 107 and address pins 106 to perform a variety of operations within the memory system 110, such as to perform a debug operation, or read and write data to memory device portion 145, as described herein. The controller 125 can be implemented as electronic hardware, such as an FPGA, ASIC, digital signal processor (DSP), or other processing circuitry, and can execute instructions (e.g., firmware) on the electronic hardware to perform the operations. For example, host 105 may transmit an address over an address bus to which address pins 106 of memory system 110 are connected. Host 105 may also transmit data (including commands) over a data bus to which data pins 107 of memory system 110 are connected. Controller 125 may monitor the address provided over the address bus and when the address matches the address associated with controller 125 may extract the data from the data bus along with corresponding commands. For example, the command transmitted over the data bus may include a debug instruction and one or more debug parameters (e.g., debug clock frequency, debug protocol, etc.).

For example, the external debugging component 120 may transmit a command to the host 105 requesting a specific debugging operation. The external debugging component 120 may include a cJTAG interface. The external component 120 may be configured to communicate and debug a target device using the cJTAG interface. The cJTAG interface is a common interface for debugging defined as part of the IEEE 1149.7 standard though any other suitable interface may be used.

The command from the external debugging component 120 may identify the target device that the external debugging component 120 desires to debug (e.g., by specifying an address of the device). The command may also indicate various debugging parameters (e.g., the debugging protocol (e.g., cJTAG protocol), the debugging frequency, the pins over which debugging information will be exchanged) of the external debugging component 120. The host 105 may transmit a command, address or data bus 107/106 coupled to address or data pins of the memory system 110 implementing the addressed target device. The command may include a debugging instruction and may include the debugging parameters. The controller 125 associated with the target device, implemented on the same memory system 110, may detect that the address received on the address or data bus 107/106 matches the address of the target device. The controller 125 may extract the debugging instruction and the debugging parameters from the received command. The controller 125 may activate the debugging module 130 (which may be implemented by the controller 125) by sending an internal instruction with the activation command and the debugging parameters to the debugging module 130.

In some implementations, external debugging component 120 may include any device or interface (e.g., cJTAG interface) that is configured to communicate with another device according to a debugging protocol. For example, external debugging component 120 may be a device that is configured to perform debugging operations according to the cJTAG protocol. External debugging component 120 may be physically connected to one or more non-data or non-test pins of memory system 110 (e.g., by being soldered to the pins or communication paths connected to those pins). As used herein, the term "data pin" or "test pin" refers to a pin of a die, chip or package that is defined by the specifications of the die, chip or package for use in exchange of data and test signals (e.g., debug signals), respectively. The term "non-data pin" or "non-test pin" refers to any other pin that is not defined by the specification of the die, chip or package for use in the exchange of data or test signals (e.g., a UFS hardware reset pin RST_N and UFS reference clock pin REF_CLK).

Debugging module 130 may be connected to clock pin 124 and reset pin 122. Host 105 may provide a reference clock signal to memory system 110 over clock pin 124. The reference clock signal may correspond to the operating clock frequency of memory system 110 according to the specifications of memory system 110. Debugging module may also be connected to test pins 112. Test pins 112 may include pins dedicated for performing debugging operations (e.g., TMSC and TCKC pins). In some implementations, all of the pins of memory system 110 may be connected to a supporting structure (e.g., a PCB) except test pins 112. Pins that are connected to the supporting structure of memory system 110 are illustrated with solid circles and pins that are not connected to the supporting structure are illustrated as empty circles. Because test pins 112 of memory system 110 are not connected to the supporting structure, alternate or non-data/non-test pins may be used by external debugging component 120 to perform debugging operations. For example, external debugging component 120 may use reset pin 122 to exchange debugging information with debugging module 130.

In response to receiving a debugging instruction from controller 125, debugging module 130 may be activated. The debugging instruction may indicate that non-test or non-data pins need to be used instead of test pins 112 for exchanging debugging information with external debugging component 120. For example, debugging module 130 may avoid performing a reset operation and other devices may avoid performing a reset operation when signals are received over reset pin 122. In an example, after being activated, the debugging module 130 may change the function of one of the two non-test pins (e.g., clock pin 124 and reset pint 122) to enable debugging information to be exchanged with the external debugging component 120. For example, the debugging module may be connected to a reset pin 122 of the die (which may be unidirectional) and may change the function of the pin to enable bidirectional data transfers (e.g., by not performing a reset operation associated with that pin in response to receiving a signal over the reset pin). In particular, the debugging module 130 may receive instructions or data from the external debugging component 120 over the reset bit and may send instructions or data back over the reset pin. In particular, instead of using the typical debugging pins or test pins 112 of the memory system 110 (which include data pins), the external debugging component 120 may communicate with the internal debugging module 130 over non-debugging, non-data or non-test pins (e.g., a reset pin 122). In some implementations, each device on memory system 110 may be coupled to reset pin 122 via a switch 150 (e.g., a transistor) except debugging module 130. In such circumstances, to change the function of reset pin 122, debugging module 130 may turn off the switch 150 to prevent signals received over reset pin 122 from being provided to such devices using control input 152. In some implementations, each device in memory system 110 may be coupled to clock pin 124 via a switch (not shown) except debugging module 130. In such circumstances, to change the function of clock pin 124, debugging module 130 may turn off the switch to prevent signals received over clock pin 124 from being provided to such devices using control input 152.

In some implementations, debugging module 130 may retrieve debugging parameters from the debugging command to determine the debugging clock frequency of the debugging protocol of external debugging component 120. For example, the external debugging component 120 may inform host 105 about the specific debugging frequency of the external debugging component 120 when or after the external debugging component 120 instructs the host 105 to send the debugging command to the memory device 145. The debugging module 130 may receive the information identifying the debugging frequency and may skew the clock signal (e.g., using a PLL of the debugging module 130) to match the debugging frequency specified by external debugging component 120. As such, the debugging module 130 and the external debugging component 120 may operate on the same clock frequency. For example, the external debugging component 120 may be coupled to host 105 that is coupled to the memory device 145. Debugging module 130 may skew the reference clock signal received from clock pin 124 to match the debugging clock frequency. In some implementations, the debugging module 130 may receive a clock signal from a given non-test pin (e.g., clock pin 124) of the memory system 110 on which the debugging module 130 is implemented. The clock signal may be received from host 105 or may be locally generated on the memory system 110. The frequency of this clock signal may correspond to the operating frequency of one or more devices implemented on the memory system 110. For example, the clock frequency may match the clock frequency of one or more memory devices 145 or controllers 125 implemented on the memory system 110. In such circumstances, the debugging module 130 may determine the clock frequency of the debugging protocol of the external debugging component 120. The debugging module 130 may skew or change the frequency of the received clock signal to match the frequency of the external debugging component 120. For example, the debugging protocol may specify the debugging frequency as ranging from 10-100 MHz.

In some implementations, external debugging component 120 may be connected to clock pin 124 or a communications path that includes the reference clock being supplied to clock pin 124. In these circumstances, external debugging component 120 may synchronize the phase of the debugging clock signal between the debugging clock of external debugging component 120 and the debugging clock signal established by debugging module 130. In particular, external debugging component may implement the same or similar circuitry (e.g., PLL circuitry) as debugging module 130 for skewing or changing the reference clock signal to match a debugging clock signal specified by the debugging protocol. Because both external debugging component 120 and debugging module 130 receive the same clock signal (reference clock from host 105) and establish a debugging clock based on that same clock signal, the resulting debugging clock signal phase is synchronized between external debugging component 120 and debugging module 130.

In some implementations, the external debugging component 120 may only connect to a single non-test pin and exchange debugging information with the internal debugging module 130 over the single non-test pin (e.g., the reset pin 122). In such circumstances, before starting to exchange debugging information, a phase alignment process may be performed to align or synchronize the phase of the debugging clock signal, established by the internal debugging module 130 based on the received host clock signal over the clock pin 124, with the phase of the clock signal of the external debugging component 120. The phase alignment process may include the external debugging component 120 initially providing a debugging clock signal over the reset pin 122 after the debugging module 130 is activated. The debugging module 130 may then match the internally established debugging clock signal with the clock signal received over the reset pin 122 from the external debugging component. After a threshold period of time, the two clock signals (external clock signal supplied over the reset line and the internally established clock signal of the debugging module based on the host clock signal) may be aligned. After the threshold period of time, the external debugging component 120 may begin sending data and instructions over the reset pin 122 to the internal debugging module 130 and may begin receiving data and instructions from the debugging module 130 over the same pin 22.

Debugging module 130 may transmit to external debugging component 120 via reset pin 122 (the non-data or non-test pin) debugging information being requested by external debugging component 120. For example, the external debugging component 120 may instruct the internal debugging module 130 to provide status or content of one or more internal data structures or registers of one or more devices (e.g., memory devices 145 or controllers 125) implemented on the memory system 110. The internal debugging module 130 may communicate with the internal devices to obtain the internal data and transmit the data as debugging information to the external debugging component 120. After the external debugging component 120 completes the debugging operation, the external debugging component may transmit an instruction over the reset pin 122 to the debugging module 130 to deactivate the debugging mode of operation. The debugging module 130 may instruct the controller 125 implemented on the memory system 110 to resume normal operating mode and may change the function of the non-data pin or non-test pin to the default or original function (e.g., reset).

For example, debugging module 130 may retrieve data from memory device 145 (or other internal registers or data structures) and may provide that retrieved data to external debugging component 120 over reset pin 122. External debugging component 120 may provide data and instructions over reset pin 122 to debugging module 130 to modify the contents of the memory device 145 or other internal registers or structures and debugging module 130 may modify the contents of the memory device 145 or other internal registers or structures based on the received data.

Figure 2:
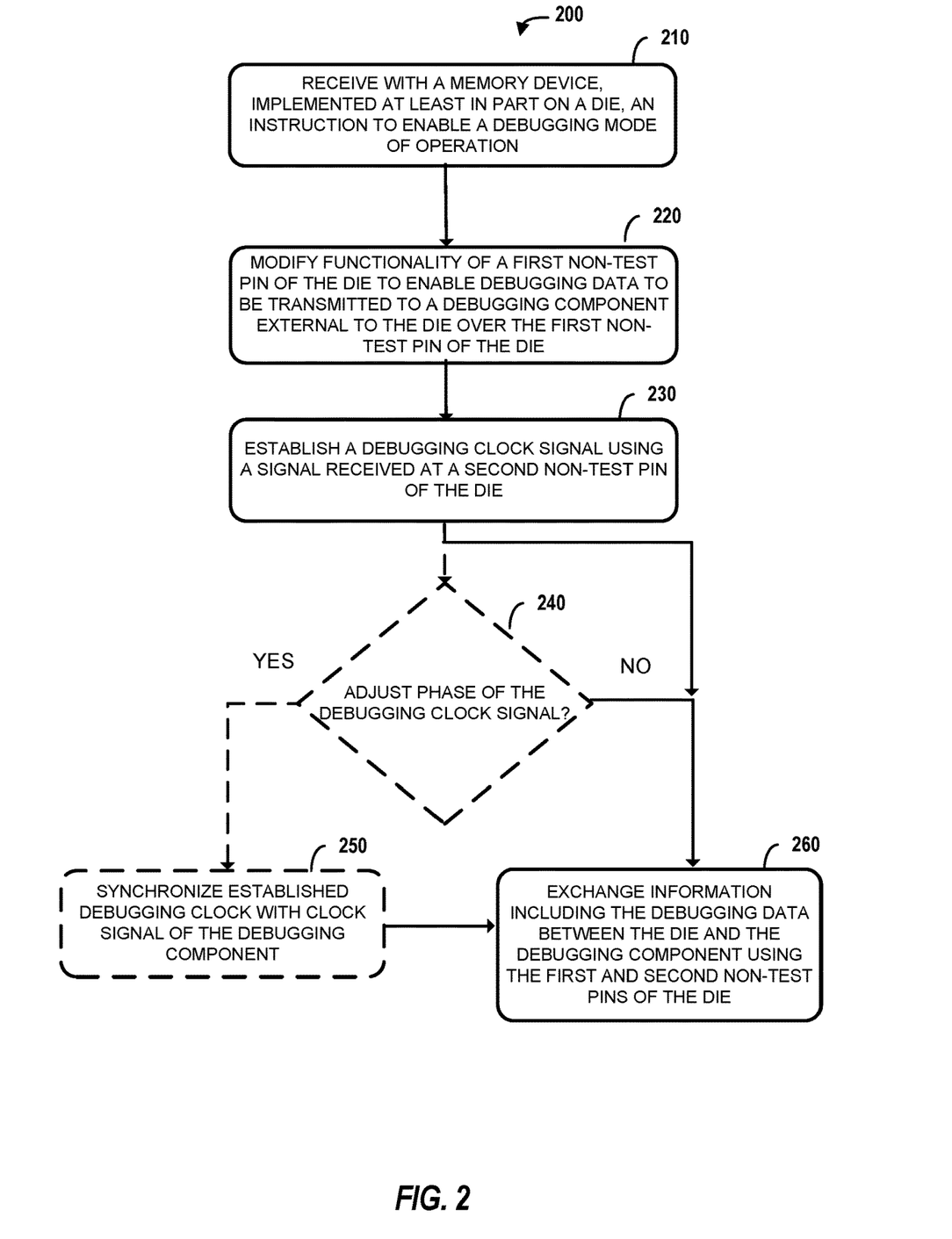
FIG. 2 illustrates an example process for debugging a memory device, in accordance with some examples of the present disclosure.

FIG. 2 illustrates an example process 200 for debugging a memory device, in accordance with some examples of the present disclosure. Dotted lines illustrated in FIG. 2 represent optional steps of process 200 that may be omitted in certain implementations. Any one of the processors described herein may perform process 200. The steps of process 200 may be performed in any order or may be omitted entirely.

At 210, an instruction to enable a debugging mode of operation is received with a memory device implemented at least in part on a die. For example, host 105 may receive a request from external debugging component 120 to activate a debugging mode of a memory device 145. In response, host 105 may generate a command including an address and debugging instruction for transmission to memory system 110 on which memory device 145 is implemented over pins 107 and 106. The command may include an identification of the device to which the debug command is directed, debugging parameters, and a request to enable the debug mode of operation in the target device. Controller 125 may receive the command from host 105 over pins 107 and 106 and may communicate an instruction, including the debugging parameters, to activate debugging module 130 for debugging memory device 145.

At 220, functionality of a first non-test pin of the die is modified to enable debugging data to be transmitted to a external debugging component external to the die over the first non-data pin of the die. For example, debugging module 130 may determine that the debugging parameters indicate that the debugging data is to be exchanged using reset pin 122 (a non-data and non-test pin) of memory system 110 rather than test pins 112. In response, debugging module may disregard or not perform a reset when subsequent signals are received over reset pin 122 and may instruct other devices on memory system 110 to also disregard reset signals during the debugging mode of operation. In some implementations, each device on memory system 110 may be coupled to reset pin 122 via a switch (e.g., a transistor) except debugging module 130. In such circumstances, to change the function of reset pin 122, debugging module 130 may turn off the switch to prevent signals received over reset pin 122 from being provided to such devices.

At 230, a debugging clock signal is established using a signal received at a second non-test pin of the die. For example, debugging module 130 may receive a reference clock from host 105 over clock pin 124 (a non-test pin). Debugging module 130, based on the debugging parameters, may determine a frequency of the debugging clock signal corresponding to the debugging protocol. In response, debugging module may skew or change the reference clock signal frequency to match the debugging clock signal.

At 240, a determination is made as to whether to adjust phase of the debugging clock signal. In response to determining to adjust the phase, the process proceeds to step 250, otherwise the process proceeds to step 260. For example, debugging module 130 may determine whether the debugging parameters include a request to synchronize or adjust the phase of the established debugging clock. In an example, debugging module 130 may compare a clock signal received from external debugging component 120 (e.g., over reset pin 122) with a locally generated clock signal (e.g., a clock signal generated by PLL of debugging module 130 based on a reference clock signal received from host 105). In response to determining that the phases of the two clock signals are not aligned, the debugging module 130 may adjust the phase of the locally generated clock signal (e.g., using the local PLL) to match the phase of the received from clock from external debugging component 120.

At 250, the established debugging clock is synchronized with the clock signal of the external debugging component. For example, debugging module 130 may receive initially a target clock signal from external debugging component 120 over reset pin 122. Debugging module 130 may adjust the phase of the established debugging clock signal to match the phase of the clock signal received over reset pin 122. After a threshold period of time, external debugging component 120 may begin transmitting instructions and data over reset pin 122 instead of the target clock signal. In some implementations, the clock signal of external debugging component 120 may be synchronized with the debugging clock signal established by debugging module 130 by skewing a reference clock signal received from host 105 using the same or similar circuitry as debugging module 130.

At 260, information including the debugging data is exchanged between the die and the external debugging component using the first and second non-test pins of the die. For example, debugging module 130 may communicate with memory device 145 to obtain data from one or more data structures or registers and may provide this obtained data via reset pin 122 to external debugging component 120.

Figure 3:
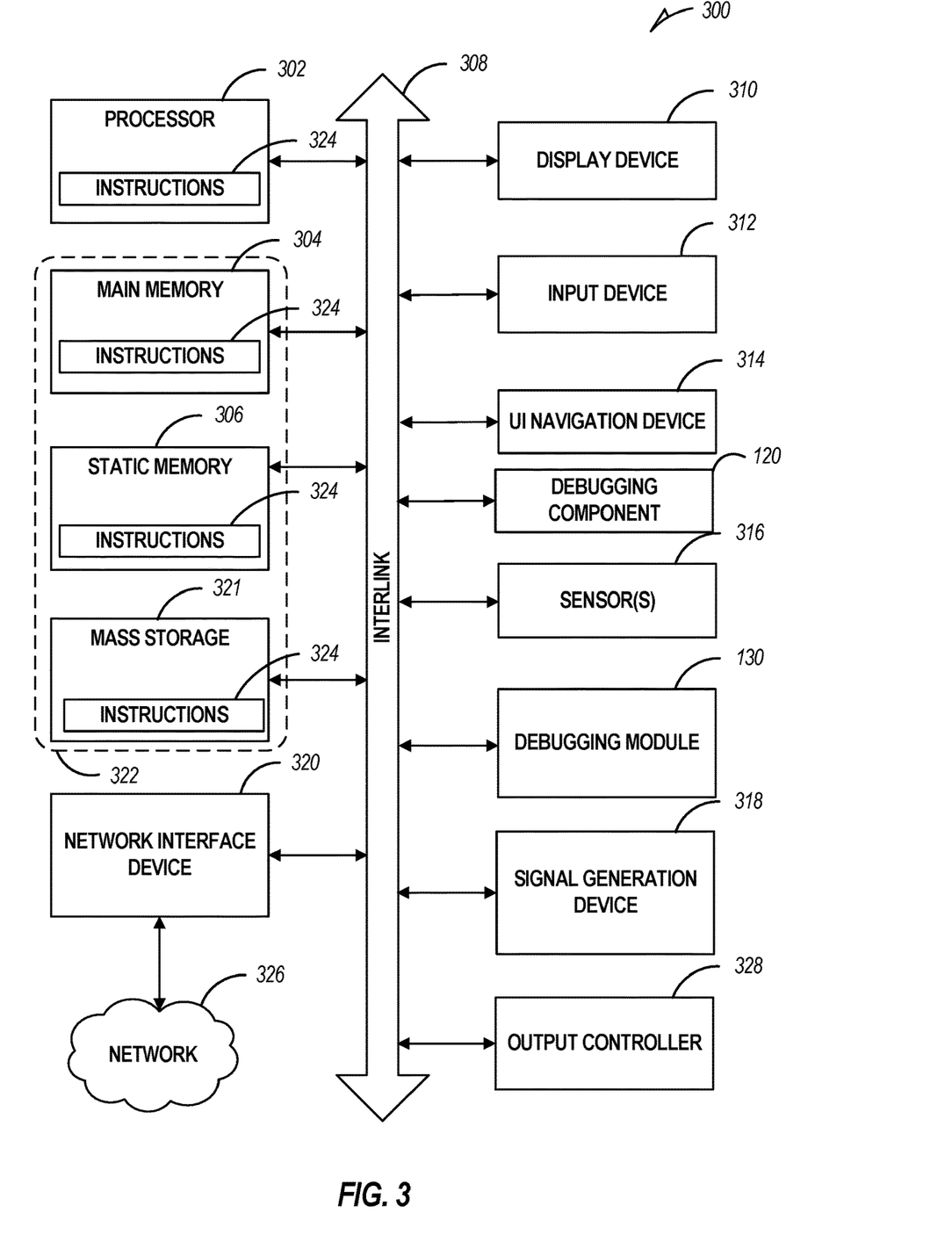
FIG. 3 illustrates an example computer system in which embodiments of the present disclosure may operate.

FIG. 3 illustrates an example machine of a computer system 300 within which a set of instructions, for causing the machine to perform any one or more of the methodologies discussed herein including process 200, can be executed. In some implementations, the computer system 300 can correspond to a host system (e.g., the host system 105 of FIG. 1) that includes or utilizes a memory system (e.g., the memory devices implemented on memory system 110 of FIG. 1) or can be used to perform the operations of a controller (e.g., to execute an operating system to perform operations corresponding to debugging operations such as described herein). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random-access memory (DRAM) such as synchronous DRAM (SDRAM) or Rambus DRAM (RDRAM), etc.), a static memory 306 (e.g., flash memory, static random-access memory (SRAM), etc.), external debugging component 120, debugging module 130, and a data storage system 318, which communicate with each other via a bus 330.

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein including those of process 200. The computer system 300 can further include a network interface device 308 to communicate over the network 320.

The data storage system 318 can include a machine-readable storage medium 324 (also known as a computer-readable medium) on which is stored one or more sets of instructions or software 326 embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable storage medium 324, data storage system 318, and/or main memory 304 can correspond to the memory devices 145 or memory system 110 of FIG. 1.

In one implementation, the instructions 326 include instructions to implement functionality corresponding to debugging operations. While the machine-readable storage medium 324 is shown in an example implementation to be a single medium, the term "machine-readable storage medium" should be taken to include a single medium or multiple media that store the one or more sets of instructions. The term "machine-readable storage medium" shall also be taken to include any transitory or non-transitory medium that is capable of storing or encoding a set of transitory or non-transitory instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a transitory or non-transitory machine-readable medium having stored thereon transitory or non-transitory instructions, which can be used to program a computer system (or other electronic devices) to perform a process according to the present disclosure. A transitory or non-transitory machine-readable medium includes any mechanism for storing information in a form readable by a machine (e.g., a computer). In some implementations, a transitory or non-transitory machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will be understood that the term module (e.g., debugging module) can refer to any combination of software and circuitry to perform or configured to perform the described function. Module may refer to a programmable device, non-programmable device, ASIC, PLD, FGPA, or other dedicated or specific circuitry or hardware element configured to perform the described function. Module may refer to software (e.g., computer readable instruction(s), code or a program running on a computer or processor or control circuitry) configured to perform the described function.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

Examples

An example (e.g., "Example 1") of subject matter (e.g., a method or system) can include a method for receiving with a memory device, implemented at least in part on a die, an instruction to enable a debugging mode of operation; and in response to receiving the instruction: modifying functionality of a first non-test pin of the die to enable debugging data to be transmitted to a debugging component external to the die over the first non-test pin of the die; establishing a debugging clock signal using a signal received at a second non-test pin of the die; and exchanging information including the debugging data between the die and the debugging component using the first and second non-test pins of the die.

In Example 2, the subject matter of Example 1 can optionally be configured such that receiving the instruction comprises receiving a command including the instruction over a data bus of the die during a normal operating mode of the die.

In Example 3, the subject matter of Example 1 can optionally be configured such that the first non-test pin comprises a reset pin of the die, and the second non-test pin comprises a reference clock pin of the die.

In Example 4, the subject matter of Example 1 can optionally be configured such that the die is placed on a circuit board, wherein the die includes debugging pins that are not coupled to the circuit board, and wherein the information is exchanged with the debugging component using the first and second non-test pins instead of the debugging pins.

In Example 5, the subject matter of Example 1 can optionally be configured such that modifying the functionality of the first non-test pin comprises changing the first non-test pin from operating as a unidirectional pin to operate as a bidirectional pin.

In Example 6, the subject matter of Example 1 can optionally be configured such that establishing the debugging clock comprises: receiving, as the signal received at the second non-test pin, a reference clock signal with the memory device; determining a clock frequency associated with a debugging protocol corresponding to the debugging component; skewing the reference clock signal to match the clock frequency to establish the debugging clock; and applying the skewed reference clock signal to a debugging device, implemented on the die, associated with the memory device.

In Example 7, the subject matter of Example 1 can optionally be configured such that exchanging the information comprises: accessing an internal data structure of the memory device to obtain the debugging data; and transmitting the obtained data over the first non-test pin to the debugging component.

In Example 8, the subject matter of Example 7 can optionally be configured for receiving the information over the first non-test pin from the debugging component; and modifying contents of the internal data structure based on the received information.

In Example 9, the subject matter of Example 1 can optionally be configured for determining a point of failure of the memory device based on the exchanged information.

In Example 10, the subject matter of Example 1 can optionally be configured such that the external component comprises a cJTAG interface, wherein the first non-test pin comprises a UFS RST_N pin, and the second non-test pint comprises a UFS REF_CLK pin.

An example (e.g., "Example 11") of subject matter (e.g., a method or system) can include a system comprising control circuitry configured to receive with a memory device, implemented at least in part on a die, an instruction to enable a debugging mode of operation; and in response to receiving the instruction: modify functionality of a first non-test pin of the die to enable debugging data to be transmitted to a debugging component external to the die over the first non-test pin of the die; establish a debugging clock signal using a signal received at a second non-test pin of the die; and exchange information including the debugging data between the die and the debugging component using the first and second non-test pins of the die.

In Example 12, the subject matter of Example 11 can optionally be configured such that the control circuitry is configured for receiving the instruction by receiving a command including the instruction over a data bus of the die during a normal operating mode of the die.

In Example 13, the subject matter of Example 11 can optionally be configured such that the first non-test pin comprises a reset pin of the die, and the second non-test pin comprises a reference clock pin of the die.

In Example 14, the subject matter of Example 11 can optionally be configured such that the die is placed on a circuit board, wherein the die includes debugging pins that are not coupled to the circuit board, and wherein the information is exchanged with the debugging component using the first and second non-test pins instead of the debugging pins.

In Example 15, the subject matter of Example 11 can optionally be configured such that the control circuitry is configured for modifying the functionality of the first non-test pin by changing the first non-test pin from operating as a unidirectional pin to operate as a bidirectional pin.

In Example 16, the subject matter of Example 11 can optionally be configured such that the control circuitry is configured for establishing the debugging clock by: receiving, as the signal received at the second non-test pin, a reference clock signal with the memory device; determining a clock frequency associated with a debugging protocol corresponding to the debugging component; skewing the reference clock signal to match the clock frequency to establish the debugging clock; and applying the skewed reference clock signal to a debugging device, implemented on the die, associated with the memory device.

In Example 17, the subject matter of Example 11 can optionally be configured such that the control circuitry is configured for exchanging the information by: accessing an internal data structure of the memory device to obtain the debugging data; and transmitting the obtained data over the first non-test pin to the debugging component.

In Example 18, the subject matter of Example 17 can optionally be configured for receiving the information over the first non-test pin from the debugging component; and modifying contents of the internal data structure based on the received information.

In Example 19, the subject matter of Example 11 can optionally be configured such that the control circuitry is configured for determining a point of failure of the memory device based on the exchanged information.

In Example 20, the subject matter of Example 11 can optionally be configured such that the external component comprises a cJTAG interface, wherein the first non-test pin comprises a UFS RST_N pin, and the second non-test pint comprises a UFS REF_CLK pin.

An example (e.g., "Example 21") of subject matter (e.g., a system or apparatus) can optionally combine any portion or combination of any portion of any one or more of Examples 1-20 to include "means for" performing any portion of any one or more of the functions or methods of Examples 1-20, or a "machine-readable medium" (e.g., non-transitory, etc.) including instructions that, when performed by a machine, cause the machine to perform any portion of any one or more of the functions or methods of Examples 1-20.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
   receiving with a memory device, implemented at least in part on a die, an instruction to enable a debugging mode of operation; and
   in response to receiving the instruction:
   modifying functionality of a first non-test pin of the die to enable debugging data to be transmitted to a debugging component external to the die over the first non-test pin of the die, modifying the functionality of the first non-test pin comprising changing the first non-test pin from operating as a unidirectional pin to operate as a bidirectional pin;
   establishing a debugging clock signal using a signal received at a second non-test pin of the die; and
   exchanging information including the debugging data between the die and the debugging component using the first and second non-test pins of the die.

2. The method of claim 1, wherein receiving the instruction comprises receiving a command including the instruction over a data bus of the die during a normal operating mode of the die.

3. The method of claim 1, wherein the first non-test pin comprises a reset pin of the die, and wherein the second non-test pin comprises a reference clock pin of the die.

4. The method of claim 1, wherein the die is placed on a circuit board, wherein the die includes debugging pins that are not coupled to the circuit board, and wherein the information is exchanged with the debugging component using the first and second non-test pins instead of the debugging pins.

5. The method of claim 1, wherein exchanging the information comprises:
   accessing an internal data structure of the memory device to obtain the debugging data; and
   transmitting the obtained data over the first non-test pin to the debugging component.

6. The method of claim 5 further comprising:
   receiving the information over the first non-test pin from the debugging component; and
   modifying contents of the internal data structure based on the received information.

7. The method of claim 1 further comprising determining a point of failure of the memory device based on the exchanged information.

8. The method of claim 1, wherein the external component comprises a cJTAG interface, wherein the first non-test pin comprises a Universal Flash Storage (UFS) RST_N pin, and the second non-test pint comprises a UFS REF_CLK pin.

9. A method comprising:
   receiving with a memory device, implemented at least in part on a die, an instruction to enable a debugging mode of operation; and
   in response to receiving the instruction:
   modifying functionality of a first non-test pin of the die to enable debugging data to be transmitted to a debugging component external to the die over the first non-test pin of the die;
   establishing a debugging clock signal using a signal received at a second non-test pin of the die, establishing the debugging clock signal comprising:
     receiving, as the debugging clock signal received at the second non-test pin, a reference clock signal with the memory device,
     determining a clock frequency associated with a debugging protocol corresponding to the debugging component,
     skewing the reference clock signal to match the clock frequency to establish the debugging clock, and
     applying the skewed reference clock signal to a debugging device, implemented on the die, associated with the memory device; and
   exchanging information including the debugging data between the die and the debugging component using the first and second non-test pins of the die.

10. A system comprising:
    control circuitry configured to:
    receive with a memory device, implemented at least in part on a die, an instruction to enable a debugging mode of operation; and
    in response to receiving the instruction:
    modify functionality of a first non-test pin of the die to enable debugging data to be transmitted to a debugging component external to the die over the first non-test pin of the die;
    establish a debugging clock signal using a signal received at a second non-test pin of the die; and
    exchange information including the debugging data between the die and the debugging component using the first and second non-test pins of the die, the first non-test pin comprising a reset pin of the die, and the second non-test pin comprising a reference clock pin of the die.

11. The system of claim 10, wherein the control circuitry is configured to receive the instruction by receiving a command including the instruction over a data bus of the die during a normal operating mode of the die.

12. The system of claim 10, wherein the die is placed on a circuit board, wherein the die includes debugging pins that are not coupled to the circuit board, and wherein the information is exchanged with the debugging component using the first and second non-test pins instead of the debugging pins.

13. The system of claim 10, wherein the control circuitry is configured to modify the functionality of the first non-test pin by changing the first non-test pin from operating as a unidirectional pin to operate as a bidirectional pin.

14. The system of claim 10, wherein the control circuitry is configured to establish the debugging clock by:
   receiving, as the signal received at the second non-test pin, a reference clock signal with the memory device;
   determining a clock frequency associated with a debugging protocol corresponding to the debugging component;
   skewing the reference clock signal to match the clock frequency to establish the debugging clock; and
   applying the skewed reference clock signal to a debugging device, implemented on the die, associated with the memory device.

15. The system of claim 10, wherein the control circuitry is configured to exchange the information by:
   accessing an internal data structure of the memory device to obtain the debugging data; and
   transmitting the obtained data over the first non-test pin to the debugging component.

16. The system of claim 15, wherein the control circuitry is further configured to:
   receive the information over the first non-test pin from the debugging component; and
   modify contents of the internal data structure based on the received information.

17. The system of claim 10, wherein the control circuitry is further configured to determine a point of failure of the memory device based on the exchanged information.

18. The system of claim 10, wherein the external component comprises a cJTAG interface, wherein the first non-test pin comprises a Universal Flash Storage (UFS) RST_N pin, and the second non-test pint comprises a UFS REF_CLK pin.

* * * * *